United States Patent [19]

Brown

[11] Patent Number: 5,023,558

[45] Date of Patent: Jun. 11, 1991

[54] IGNITION WIRE CORE CONDUCTIVE IRREGULARITY DETECTOR

[75] Inventor: Lewis M. Brown, Columbia City, Ind.

[73] Assignee: Essex Group, Inc., Fort Wayne, Ind.

[21] Appl. No.: 351,980

[22] Filed: May 15, 1989

[51] Int. Cl.[5] .............................................. G01R 31/08

[52] U.S. Cl. .................................... 324/515; 324/543; 324/525

[58] Field of Search ............... 324/541, 542, 543, 544, 324/515, 525, 513; 29/593; 242/7.12, 25 R

[56] References Cited

U.S. PATENT DOCUMENTS

| | | |
|---|---|---|
| 2,476,279 | 10/1949 | Boynton . |
| 2,643,285 | 6/1953 | Cranford . |
| 3,394,896 | 7/1968 | Reichelt . |
| 3,500,188 | 3/1970 | Whitley . |
| 3,694,736 | 9/1972 | Wakefield . |
| 3,748,577 | 7/1973 | Jones, Jr. . |
| 3,777,259 | 12/1973 | Clinton . |
| 3,863,148 | 1/1975 | Fellrath . |
| 3,890,179 | 6/1975 | Deardurff . |
| 3,890,567 | 6/1975 | Knüfflmann et al. . |
| 4,241,304 | 12/1980 | Clinton . |

FOREIGN PATENT DOCUMENTS

| | | | |
|---|---|---|---|
| 530229 | 7/1931 | Fed. Rep. of Germany | 324/59 |
| 885891 | 7/1949 | Fed. Rep. of Germany | 324/62 |
| 584264 | 12/1977 | U.S.S.R. | 324/61 |
| 1432430 | 10/1988 | U.S.S.R. | 324/544 |
| 256680 | 5/1926 | United Kingdom | 324/59 |

*Primary Examiner*—Kenneth Wieder
*Assistant Examiner*—Jose M. Solis
*Attorney, Agent, or Firm*—Mark F. Smith

[57] ABSTRACT

An apparatus and a method for detecting conductive irregularities in an overwrapped ignition wire core during the manufacturing process thereof which preferably includes two conductive sheaves spaced preferably 24 inches apart about which the wire core is traversed and preferably two non-conductive sheaves for bending the wire core between the two conductive sheaves. A current is induced in the overwrapped wire core between the two conductive sheaves and is monitored by preferably a Newport Model Q90010, indicator/controller module or equivalent which includes means for converting the monitored current into a resistance reading which is compared against predetermined resistance end point limits. A numerical reading indicating resistance is displaced on the face of the inductor/controller module. If the displaced resistance reading falls outside the predetermined limits, means for stopping the traverses of the overwrapped wire core between the two conductive sheaves is activated and the manufacturing process is stopped at that point. Once the conductive irregularities is eliminated, the overwrapped wire core is reconnected and is again traversed between the conductive sheaves searching for another conductive irregularity.

9 Claims, 2 Drawing Sheets

FIG. I

IGNITION WIRE CORE CONDUCTIVE IRREGULARITY DETECTOR

BACKGROUND OF THE INVENTION

The present invention relates to detecting and eliminating conductive irregularities such as conductor breaks in a wire wound ignition wire core, and, more specifically, relates to an apparatus for detecting conductive irregularities such as conductor breaks in wire wound ignition wire during the manufacturing process and to a method utilizing the apparatus for detecting these irregularities and for systematically eliminating them from the manufacturing process prior to the insulation coating being extruded thereover.

Automotive ignition wire has numerous constructions. A number of these constructions have a core consisting of a wire conductor wrapped around a rubber jacketed fiberglass cord and then given a thin coating of a semi-conductive material, over which an insulation is extruded, typically braided and then jacketed and cured.

During the production of this automotive ignition wire, conductive irregularities such as conductor breaks can occur at a number of the various steps in the manufacturing process, especially during the winding of the conductor around the rubber coated fiberglass core and the various coatings placed thereon prior to the insulation coating. This conductive irregularities problem such as conductor breaks has resulted in the rejection of entire shipments of automotive ignition wire by end users and the return thereof to the manufacturer.

In previous efforts to detect and eliminate the conductive irregularity problem, small samples of the ignition wire core were selected at random and then tested for adherence to user specifications. This method proved unacceptable because of the excessive time required and the scrap generated thereby. Additionally since this sampling method was preformed infrequently, it was unable to detect small sporadic irregularities. Since many of the conductive irregularities were small conductor breaks which resulted in relatively small increases in wire resistance due to the semi-conductive coating holding the ends of the broken wire close so that conduction of current across the break occurred, there is a need for an apparatus and a method that will systematically detect and therefore provide for the elimination of conductive irregularities such as small conductive breaks in the overwrapped ignition wire core early in the manufacturing process.

U.S. Pat. No. 3,890,179 to Deardurff provided a continuous monitoring device for measuring the resistance of the filament bundle and then compensated for variances in the conductance between the core and the semi-conductive overcoat by controlling the degree of curing. While this method of insuring uniform conductance between the core and the semi-conductive overcoat apparently worked, it did not appear to provide for the detection of small conductive irregularities such as breaks in the conductor and was most likely ineffective at speeds as high as 300 fpm.

The concept of measuring a resistance in a conductor between two points in production process is known and is illustrated in such patents as U.S. Pat. No. 3,863,148 to Fellrath, issued Jan. 28, 1975; U.S. Pat. No. 3,890,567 to Knufflmann issued June 17, 1979, and U.S. Pat. No. 3,694,736 to Wakefield issued Sept. 26, 1972. It is also known to monitor and check the continuity of an electrically insulated wire to detect breaks in conductors and the insulated wire as disclosed in U.S. Pat. No. 4,241,304 to Clinton issued Dec. 23, 1980.

These various prior art apparatus were apparently unable to satisfactorily detect the conductive irregularities such as fine breaks in the ignition wire core running at processing speeds in excess of 300 fpm, or to automatically stop the manufacturing process to allow for the elimination of the detected conductive irregularities during the manufacturing process.

Accordingly, there is a need for ignition wire core conductive irregularities detector and a method of monitoring the ignition wire core resistant during the ignition wire manufacturing process. The apparatus and the method should be employed early in the manufacturing process and should provide for stopping the manufacturing process to allow for the elimination of the conductive irregularities prior to the insulation coat being applied to the ignition wire core.

SUMMARY OF THE INVENTION

The present invention is an apparatus and a method for systematically detecting conductive irregularities in conductors, specifically overwrapped ignition wire cores. The apparatus includes monitor means for determining the resistance in a predetermined length of overwrapped ignition wire core; comparator means for comparing the determined resistance against a predetermined resistance range; current monitoring enabling means such as at least two conductive, preferably brass, sheaves spaced a predetermined distance apart for traversing the overwrapped ignition wire core therebetween; current induction means such as brushes or slip rings operatively connected to the current monitoring enabling means for inducing current in the overwrapped ignition wire core traversing between the current monitoring enabling means; nonconductive means for bending the overwrapped ignition wire core, preferably in both directions, so that small conductive irregularities such as conductor breaks can be better detected and indicator means for indicating when a determined result is outside the allowable predetermined resistance range. An additional aspect of both the apparatus and the method of the current invention includes means for stopping the ignition wire manufacturing process when the determined resistance falls outside the allowable range.

The present invention also includes a method for systematically detecting conductive irregularities in overwrapped ignition wire core comprising the steps of: providing overwrapped ignition wire core; providing current monitoring enabling means such as two conductive pulleys means spaced apart from each other, so that the overwrapped ignition wore core is traversed therebetween, in two sections of a predetermined length; inducing a small current in each of the two predetermined length sections; monitoring the voltage in the overwrapped wire core between the two conductive sheaves; determining the resistance within the two predetermined lengths; comparing the determined resistance to a predetermined range and when the determined resistance is outside the predetermined range, alerting an operator to the out of range condition. An additional aspect of the method of the present invention also includes when the measured resistance is outside the predetermined range, stopping the ignition wire core manufacturing process immediately following the conductive irregularities detection. A still further aspect of the method of the present invention includes eliminating the section of overwrapped ignition wire core having the determined resistance outside the predetermined range and thereafter reconnecting the overwrapped ignition wire core and continuing the manufacturing process.

Accordingly, objects of the present invention include: providing an apparatus and a method for utilizing the apparatus to systematically detect and eliminate conductive irregularities during the manufacturing of wire, particularly overwrapped ignition wire, at the earliest possible point in the manufacturing process; providing apparatus and a method for utilizing that apparatus for stopping the manufacturing process once a conductive irregularity is detected; and to reduce the amount of defective ignition wire having conductive irregularities such as small resistance breaks from being shipped to customers.

Other objects and advantages of the invention will be apparent from the following description, the accompanying drawings and the appended claims.

DETAILED DESCRIPTION OF THE PREFERRED EMBODIMENT

Figure 1:
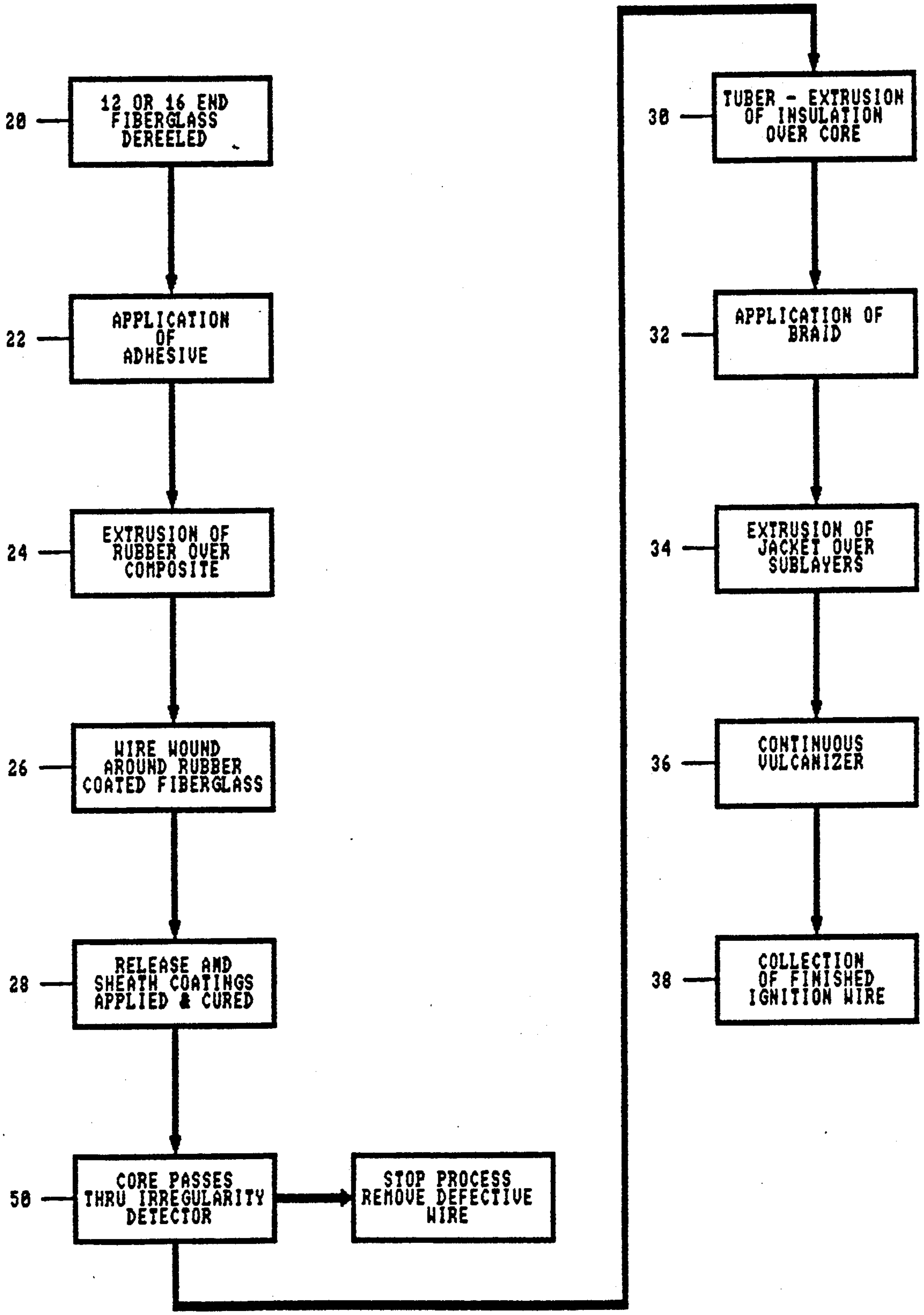
FIG. 1 is a Flow Chart illustrating one manufacturing process utilizing the present invention for detecting conductive irregularities during the production of ignition wire.

FIG. 1 diagrammatically illustrates one typical method for producing ignition wire, except for ignition wire core conductive irregularity detector 50 and a method of using the ignition wire core conductive irregularity detector 50 of the present invention. A 12 or 16 per end fiberglass cord is dereeled at 20 and then is conventionally coated with an adhesive at 22 before being conventionally processed through a conventional extruder at 24 which extrudes a thin layer of rubber over the composite coated fiberglass core. After the thin layer of rubber is extruded over the composite core, a conventional winder overwraps conductive wire thereabout at 26. From the conventional wire wrapping process at 26, the overwrapped coated fiberglass core goes to a conventional tower wherein a sheath coating and a release coating or a combination sheath/release coating are conventionally applied thereto and cured thereon at 28. It is after this point in the manufacturing process that the ignition wire core conductive irregularity conductor 50 is utilized to detect conductive irregularities such as conductor wire breaks.

The wire core conductive irregularity detector 50 of the present invention utilizes a specific method for detecting the conductive irregularities such as wire breaks in the process path. The ignition wire core conductive irregularity detector 50 and the method utilized by the detector will be discussed in detail below.

Figure 2:
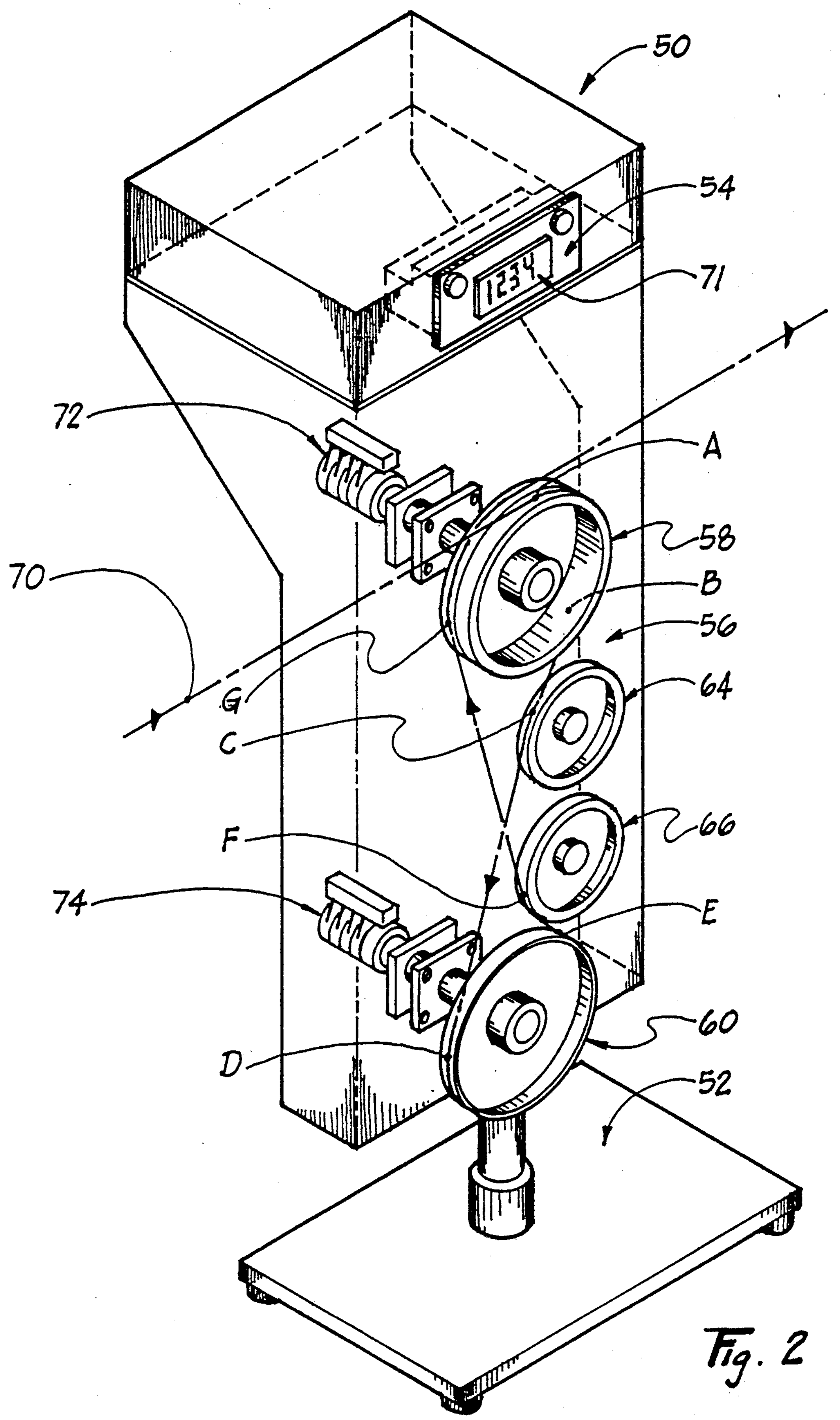
FIG. 2 is a perspective view illustrating the overwrapped ignition wire core conductive irregularity detector of the present invention.

In the illustrated manufacturing process, overwrapped ignition wire core which passes through the irregularity detector at 50 without an irregularity being detected therein is then conventionally processed through a tuber extruder which extrudes at 30 insulation over the overwrapped ignition wire core 70 (See FIG. 2). After the insulating operation at 30, the insulated overwrapped ignition wire core is typically but not always processed through a conventional braider at 32. The overwrapped ignition wire core is next processed through another conventional extruder to encase at 34 the braided or unbraided overwrapped ignition wire core within a jacket. Next, the jacketed product is processed through a conventional continuous vulcanizer at 36 wherein the finished overwrapped ignition wire is cured and collected at 38.

As shown in FIG. 2, the ignition wire core conductive irregularity detector 50 of the present invention comprises a stand 52 for supporting the detector 50. An indicator/controller module 54 capable of functioning as a four wire ohmmeter, a Newport Model Q90010 available from Newport Electronics Inc., of Santa Ana, Calif., is preferred but any other indicator/controller models capable of detecting conductive irregularity in the overwrapped wire core would suffice, is operatively positioned in the detector 50. The module 54 is electronically connected to the wire core 70 and includes a means for indicating resistance in an equivalent, preferably, one foot section of the coated overwrapped ignition core 70 moving at speeds preferably in excess of 300 ft. per minute. A current monitoring enabling means 56 preferably comprises two 6 inch diameter brass or other conductive material sheaves 56, 60 spaced preferably 24 inches apart and preferably two 5 inch diameter polyethylene or non-conductive sheaves 64, 66 positioned between the two brass sheaves 58, 60 for bending the overwrapped ignition wire core 70 in both directions during the resistance measurements is operatively positioned in the detector 50.

The overwrapped ignition wire core 70 enters the ignition wire core conductive irregularity detector 50 at approximately 300 ft. per minute, contacts the first brass sheave 58 at point A, at which point the ignition wire core 70 maintains contact with the brass sheave 58 through to point B. The overwrapped ignition wire core 70 leaves contact with the first brass sheave 58 at point B and contacts the first polyethylene sheave 64 at point C whereby the direction of the overwrapped ignition wire core 70 is changed by bending the overwrapped ignition wire core 70. Next the overwrapped ignition wire core 70 proceeds to contact the second brass sheave 60 at point D. The distance between points B and D is preferably two feet. A current is induced into the overwrapped ignition core 70 between points B and D. The voltage in the overwrapped ignition wire core 70 is continuously monitored between those two points (B and D). After point D, the overwrapped ignition wire core 70 remains in contact with the second brass sheave 60 until the direction of travel is reversed and contact broken at point E. The overwrapped core 70 then proceeds into contact with the second polyethylene sheave 66 at point F whereby the overwrapped ignition wire core 70 is further bent in the opposite direction. From the second polyethylene sheave 66, the wire core 70 continues until it again contacts the first brass sheave 58 at point G. The distance between points E and G is also preferably two feet. Current is also induced in the overwrapped ignition wire core 70 between those two points (E and G). From point G, the overwrapped ignition wire core 70 is processed to the tuber extruder 30 and then to the additional processing steps 32, 34, 36 and 38, as shown in FIG. 1.

The voltage between points B and D and E and G are constantly monitored, converted to resistance and compared against a predetermined range by the ignition wire core conductive irregularity detector 50 of the present invention. The resistance determined in the two parallel two foot sections of the overwrapped ignition wire core 70 equals the resistance of a one foot section according to the equation $1/R_T=1/R_1+1/R_2$. The Newport indicator/controller module 54 displays a digital reading 71 which indicates the resistance in a one foot section and compares that reading to the dual end limit set points programed therein. The detector is operatively connected to the process so that the progess of the overwrapped ignition wire core 70 is stopped in the event the displayed resistance value falls outside of preset limits.

The operative connection between the ignition wire core inductive irregularity detector 50 and the ignition wire manufacturing process required to stop the process is known to those skilled in the art. Any conventional circuitry which stops the ignition wire core 70 from moving through the ignition wire core conductive irregularity detector 50 will suffice. When the progress of the overwrapped ignition wire core 70 through the resistance monitor 50 is stopped, the operator effectuates means for eliminating that portion of the overwrapped ignition wire core 70 having the detected conductive irregularity therein, reconnects the wire ends and continues the manufacturing process.

In regard to inducing current within the two, two foot sections, the means for inducing this current can be conventionally provided by either motor brushes contacting the back of the brass sheave or by slip rings 72, 74 operatively connected to the brass sheaves 58, 60 in order to input preferably a 42 microamp current. The preferred 42 microamp current and the voltage developed in the overwrapped ignition wire core 70 cannot be felt and does not restrict the activities of operators who are frequently required to touch the overwrapped core 70 during the manufacturing of the ignition wire.

Utilization of the ignition wire core conductive irregularity detector 50, preferably after the application of the sheath and release coatings at 28 and before the tuber operation at 30, provides for the detection of a large number of overwrapped ignition core 70 problems that were not previously detected. The problems detected by the ignition wire core conductive irregularity detector 50 of the present invention include: conductor breaks, an absence of conductor, too tight of wrap, too loose of wrap, and double wrap. The ignition wire core conductive irregularity detector 50 and the method of systematically employing the ignition wire core conductive irregularity detector 50 has resulted in a significant reduction in returned products. However, it should be understood that while it is preferred that the ignition wire core conductive irregularity detector 50 be utilized after the release and sheath coatings have been applied in the disclosed manufacturing process, the detector 50 may be effectively employed at any location in the manufacturing process after the conductive wire has been wound on the core but before the insulation jacket has been applied or at a point where resistance changes could not be determined at the accuracy required.

While the method herein described and the form of apparatus for carrying this method into effect, constitute preferred embodiments of this invention, it is to be understood that the invention is not limited to this precise method and the form of apparatus, and that changes be made in either without departing from the scope of the invention, which is defined in the amended claims.

What is claimed is:

1. An overwrapped ignition wire core conductive irregularities detector comprising:

at least two electrical conductive sheaves, spaced a predetermined distance apart, for traversing an overwrapped ignition wire therebetween;

at least two non-electrical conductive sheaves, operatively positioned between the two conductive sheaves, for bending the overwrapped ignition wire so that small conductive breaks in the wire can be better detected between the conductive sheaves;

electric current means in direct contact with the two conductive sheaves for directly applying a small electrical current in the overwrapped ignition wire between the two sheaves as the wire traverses therebetween;

monitoring means for monitoring the voltage in the wire between the two conductive sheaves as it traverses between the two conductive sheaves at speeds in excess of 300 feet per minute; and means, operatively connected to the monitoring means, for stopping the overwrapped wire core from continuing to traverse between the two conductive sheaves when a conductive irregularity is detected.

2. An overwrapped ignition wire core conductive irregularity detector comprising:

means for determining the resistance in a predetermined length of an overwrapped ignition wire;

comparator means for comparing the determined resistance against an allowable predetermined resistance range;

current induction means for inducing current in the overwrapped ignition wire core;

at least two current monitoring enabling means, spaced a predetermined distance apart and being operatively connected to the current induction means, for traversing the overwrapped ignition wire core therebetween;

nonconductive means, operatively positioned in the detector, for bending the overwrapped ignition wire core so that small conductive irregularities can be better detected; and indicator means for indicating when the determined resistance is outside the allowable predetermined resistance range;

wherein the predetermined resistance range can be set as upper and lower resistance limits.

3. The detector of claim 2 further comprising:

means, operatively connected to the indicator means and the comparator means, for stopping the overwrapped ignition wire core when the measured resistance falls outside the predetermined resistance limits.

4. The system of claim 2 wherein the enabling means further comprises:

at least two conductive sheaves, each approximately six inches in diameter and being spaced apart approximately two feet; and at least two non-conductive sheaves, each approximately five inches in diameter and being operatively positioned between the two conductive sheaves.

5. A method for detecting conductive irregularities in overwrapped ignition wire core during the manufacturing process comprising the steps of:

providing overwrapped ignition wire core;

providing current monitoring enabling means for traversing the overwrapped wire core therebetween;

inducing a small current in the overwrapped core between the current monitoring enabling means;

monitoring the voltage in the overwrapped wire core between the current monitoring means;

determining the resistance in the overwrapped wire core;

comparing resistance determined to a predetermined resistance range;

when the determined resistance is outside the predetermined resistance range, stopping the manufacturing process;

eliminating the section of wire having determined resistance outside the predetermined range; and thereafter reconnecting the overwrapped ignition wire core containing the manufacturing process.

6. The detector of claim 5 wherein said conductive sheaves are each approximately six inches in diameter.

7. The detector of claim 5 wherein the conductive sheaves are spaced apart by approximately two feet.

8. A method for detecting conductive irregularities in overwrapped ignition wire core during the manufacturing process comprising the steps of:

providing overwrapped ignition wire core;

providing current monitoring enabling means for traversing the overwrapped wire core therebetween;

inducing a small current in the overwrapped core between the current monitoring enabling means;

monitoring the voltage in the overwrapped wire core between the current monitoring means;

determining the resistance in the overwrapped wire core;

comparing resistance determined to a predetermined resistance range; and when the determined resistance is outside the predetermined resistance range, stopping the manufacturing process;

wherein the resistance determining step is performed after a bond coat and a release coat or a combination bond-release coat has been applied to the overwrapped core.

9. An overwrapped ignition wire core conductive irregularity detector comprising:

means for determining the resistance in a predetermined length of an overwrapped ignition wire;

comparator means for comparing the determined resistance against an allowable predetermined resistance range;

current induction means for inducing current in the overwrapped ignition wire core;

at least two current monitoring enabling means, spaced a predetermined distance apart and being operatively connected to the current induction means, for traversing the overwrapped ignition wire core therebetween;

nonconductive means, operatively positioned in the detector, for bending the overwrapped ignition wire core so that small conductive irregularities can be better detected; and indicator means for indicating when the determined resistance is outside the allowable predetermined resistance range;

wherein the original ignition wire core is traveling at speeds in excess of 300 ft. per minute.

* * * * *

UNITED STATES PATENT AND TRADEMARK OFFICE
CERTIFICATE OF CORRECTION

PATENT NO. : 5,023,558

DATED : June 11, 1991

INVENTOR(S) : Lewis M. Brown

It is certified that error appears in the above-identified patent and that said Letters Patent is hereby corrected as shown below:

On the title page, in item [19] "Brown" should read -- Brown et al--;
item [75] Inventor: should be changed to --Inventors--;
item [75] The inventor --Frederick L. Phillips, Lafayette, Ind.-- should be inserted after "Lewis M. Brown, Columbia City, Ind.".

Signed and Sealed this

Twentieth Day of October, 1992

*Attest:*

DOUGLAS B. COMER

*Attesting Officer*

*Acting Commissioner of Patents and Trademarks*